United States Patent
Liang et al.

(10) Patent No.: US 8,301,405 B2
(45) Date of Patent: Oct. 30, 2012

(54) SYSTEM AND METHOD FOR MEASURING PIN VOLTAGES OF ELECTRONIC COMPONENTS

(75) Inventors: Hsien-Chuan Liang, Taipei Hsien (TW); Shen-Chun Li, Taipei Hsien (TW); Wen-Laing Tseng, Taipei Hsien (TW); Yung-Chieh Chen, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 326 days.

(21) Appl. No.: 12/754,595

(22) Filed: Apr. 5, 2010

(65) Prior Publication Data

US 2011/0161026 A1    Jun. 30, 2011

(51) Int. Cl.
*G01R 19/00* (2006.01)
*G06F 17/40* (2006.01)

(52) U.S. Cl. ..... 702/64; 702/117; 702/118; 324/754.03; 324/72.5

(58) Field of Classification Search .................. None
See application file for complete search history.

(56) References Cited

U.S. PATENT DOCUMENTS

| 5,087,874 | A | * | 2/1992 | Robinson | 324/73.1 |
| 5,564,183 | A | * | 10/1996 | Satou et al. | 29/840 |
| 5,696,450 | A | * | 12/1997 | Itoh | 324/537 |
| 2010/0295552 | A1 | * | 11/2010 | Li et al. | 324/537 |

* cited by examiner

*Primary Examiner* — Hal Wachsman
(74) *Attorney, Agent, or Firm* — Altis Law Group, Inc.

(57) ABSTRACT

A system and method uses a measurement control device and a measurement machine to measure pin voltages of electronic components installed in an electronic device. The measurement control device controls a mechanical arm of the measurement machine to move to the pins of the electronic components according to coordinates of the pins. A voltage probe installed on the end of the mechanical arm can measure voltages of the pins automatically.

9 Claims, 3 Drawing Sheets

SYSTEM AND METHOD FOR MEASURING PIN VOLTAGES OF ELECTRONIC COMPONENTS

BACKGROUND

This application claims for foreign priority based on an application CN 200910312815.2 filed in China on Dec. 30, 2009, incorporated herein by reference.

1. Technical Field

Embodiments of the present disclosure generally relate to voltage measurement, and more particularly, to a system and method for measuring pin voltage of electronic components installed in an electronic device.

2. Description of Related Art

An electronic device, such as a motherboard, consists of a plurality of electronic components, such as resistors, capacitors, inductors, for example. The electronic device cannot work due to errors or damage to one or more electronic components installed. Pin voltages of the electronic component can be measured to determine whether the electronic component has errors or damage.

However, pin voltages are measured by engineers, using voltage measurement hand tools. Thus, efficiency of the manual measurement is low and the cost of labor can be high.

DETAILED DESCRIPTION

The application is illustrated by way of examples and not by way of limitation in the figures of the accompanying drawings in which like references indicate similar elements. It should be noted that references to "an" or "one" embodiment in this disclosure are not necessarily to the same embodiment, and such references mean at least one.

In general, the word "module" as used hereinafter, refers to logic embodied in hardware or firmware, or to a collection of software instructions, written in a programming language, such as, for example, Java, C, or Assembly. One or more software instructions in the modules may be embedded in firmware. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
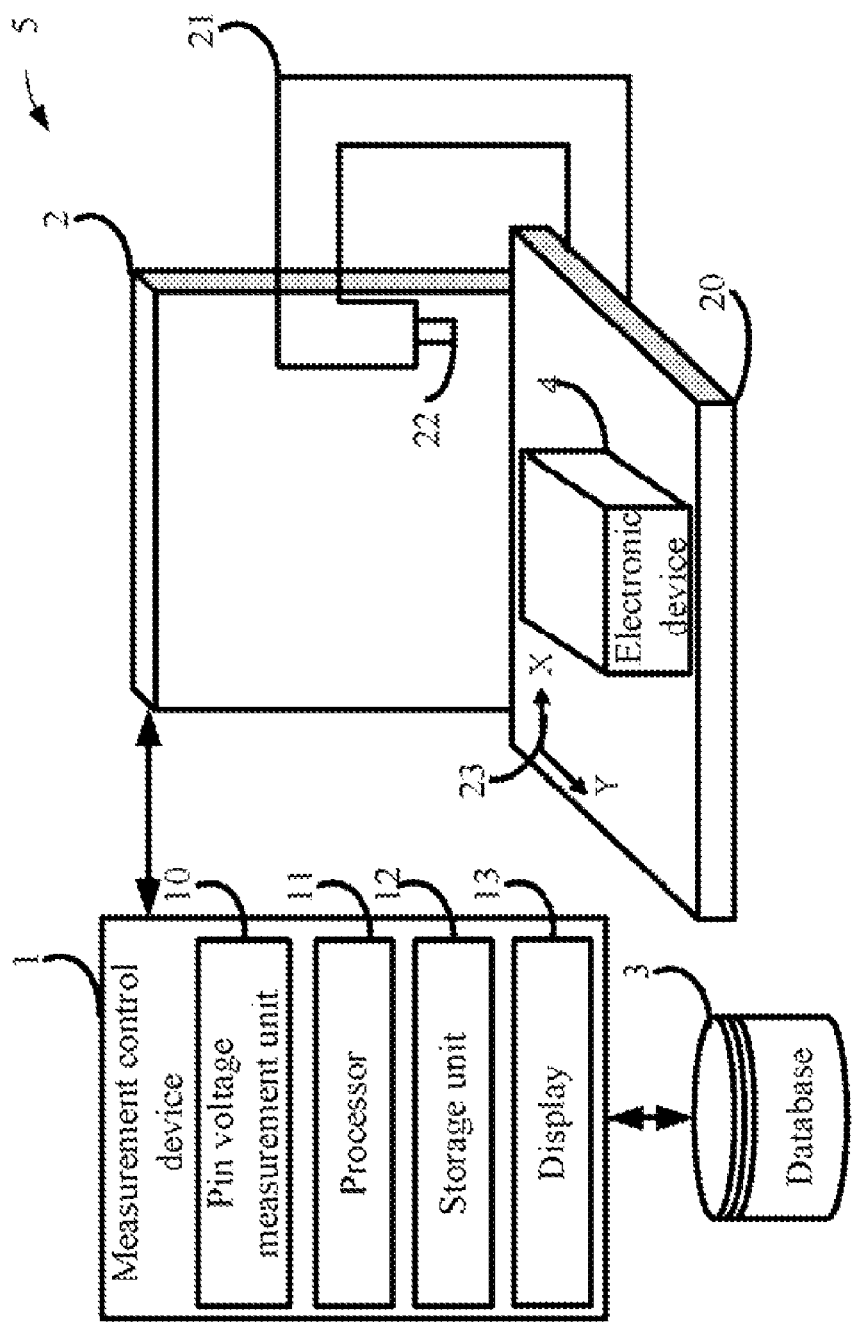
FIG. 1 is a block diagram of one embodiment of a system for measuring pin voltage of electronic components.

FIG. 1 is a block diagram of one embodiment of a measurement system 5 for measuring pin voltages of electronic components. In one embodiment, the measurement system 5 includes a measurement control device 1, a measurement machine 2, and a database 3. The measurement control device 1 communicates with the measurement machine 2 and the database 3.

The measurement control device 1 may be a computing device, such as a computer, or a server, for example. The measurement control device 1 includes a pin voltage measurement unit 10, a processor 11, and a storage unit 12. The pin voltage measurement unit 10 includes a plurality of functional modules (see below descriptions referring to FIG. 2), to control the measurement machine 2 to measure voltages of pins of electronic components installed in an electronic device 4. The processor 11 can execute one or more computerized codes of the functional modules of the pin voltage measurement unit 10. The storage unit 12 stores the one or more computerized codes of the functional modules of the pin voltage measurement unit 10.

The measurement machine 2 includes a platform 20, a mechanical arm 21, and a voltage probe 22. The electronic device 4 is positioned on the platform 20 during the measurement of pin voltages of the electronic components of the electronic device 4. In one embodiment, a coordinate system 23 is located at a corner of the platform 20. The mechanical arm 21 can move under the control of the pin voltage measurement unit 10 of the measurement control device 1. The voltage probe 22 is installed on the end of the mechanical arm 21, and is used to measure pin voltages of electronic components of the electronic device 4.

The database 3 stores basic data of the electronic components installed in the electronic device 4. The basic data includes, but is not limited to, names, coordinates of the coordinate system 23, and heights of the electronic components. The names of the electronic components may be resistor R1, R2, and R3, for example. The database 3 classifies the electronic components according to the basic data to obtain a plurality of component types of the electronic components. The component types may include, but are not limited to, a resistor, a capacitor, and/or an inductor, for example.

Figure 2:
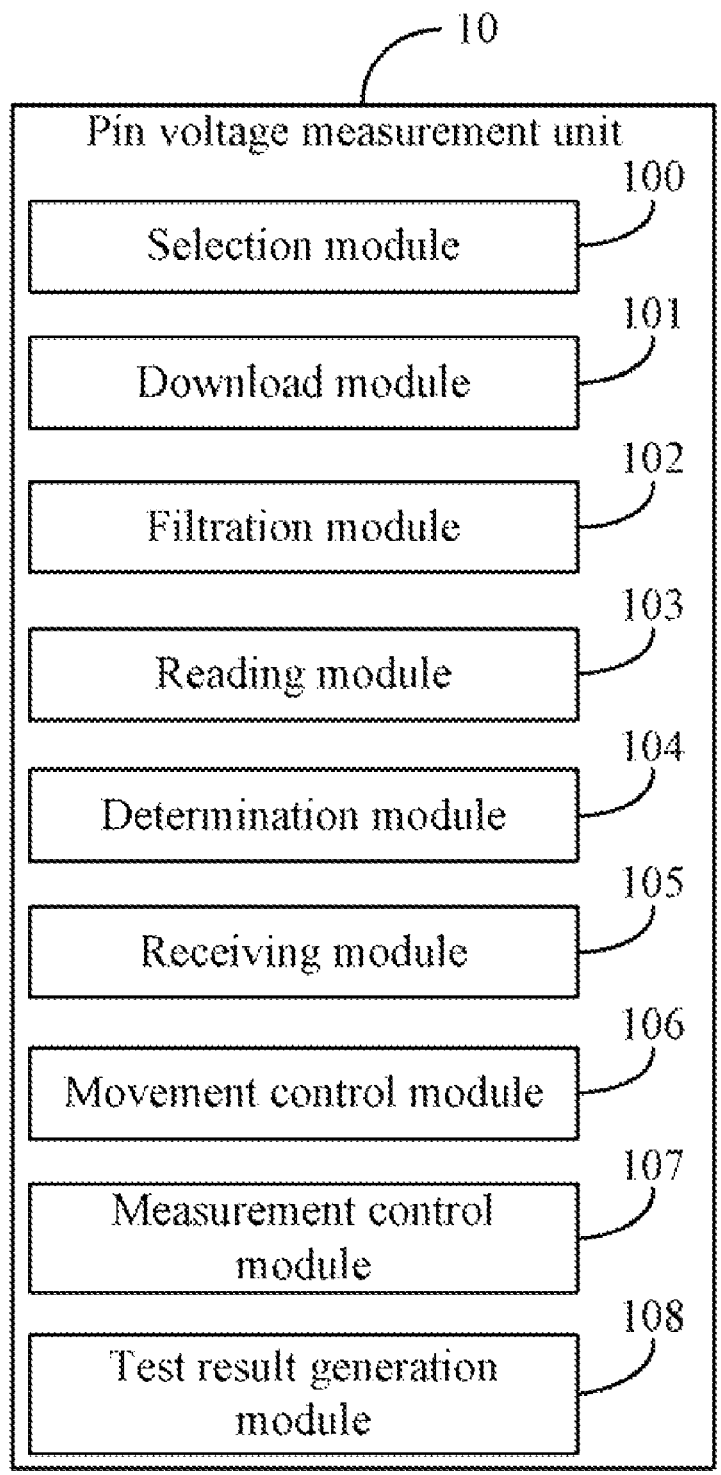
FIG. 2 is a block diagram of functional modules of a pin voltage measurement unit in FIG. 1.

FIG. 2 is a block diagram of functional modules of the pin voltage measurement unit 10. In one embodiment, the pin voltage measurement unit 10 includes a selection module 100, a download module 101, a filtration module 102, a reading module 103, a determination module 104, a receiving module 105, a movement control module 106, a measurement control module 107, and a test result generation module 108.

The selection module 100 provides a plurality of component types of the electronic components installed in the electronic device 4, so that a user can select one of the component types via a display 13 of the measurement control device 1. As mentioned above, the electronic component may be a resistor, a capacitor, or an inductor, for example.

The download module 101 sorts basic data related to a selected component type in the database 3. In one embodiment, the download module 101 can download the basic data from the database 3 to the measurement control device 1. The basic data may include names, coordinates of the coordinate system 23, and heights of the electronic components belonging to the selected component type, for example.

The filtration module 102 filters the electronic components according to the selected component type, so that the user can select one of the electronic components via the display 13 of the measurement control device 1. If the selected component type is a resistor, the filtration module 102 filters all the resistors R1, R2 or R3, for example installed in the electronic device 4.

The reading module 103 reads pin coordinates of the selected electronic component from the database 3.

The determination module 104 determines if coordinates of all the pins of the selected electronic component have been read.

The receiving module 105 receives a signal channel and a limited height of the mechanical arm 21. It is noteworthy that, the signal channel is used to transmit a control signal sent by the measurement control device 1. The control signal can control the mechanical arm 21 to move during the measurement process. The limited height is a minimum distance between the platform 20 and the voltage probe 22 when the mechanical arm 21 moves. In one embodiment, the limited height is greater than or equal to the distance between the platform 20 and the peak of the electronic device 4.

The movement control module 106 controls the mechanical arm 21 to move according to the coordinates of the pins of the selected electronic component, so the voltage probe 22 can locate the pins of the selected electronic component.

The measurement control module 107 controls the voltage probe 22 to measure the voltages of the pins of the selected electronic component.

The test result generation module 108 generates test results including the voltages of the pins of the selected electronic component, and outputs the test results on the display 13 of the measurement control device 1.

Figure 3:
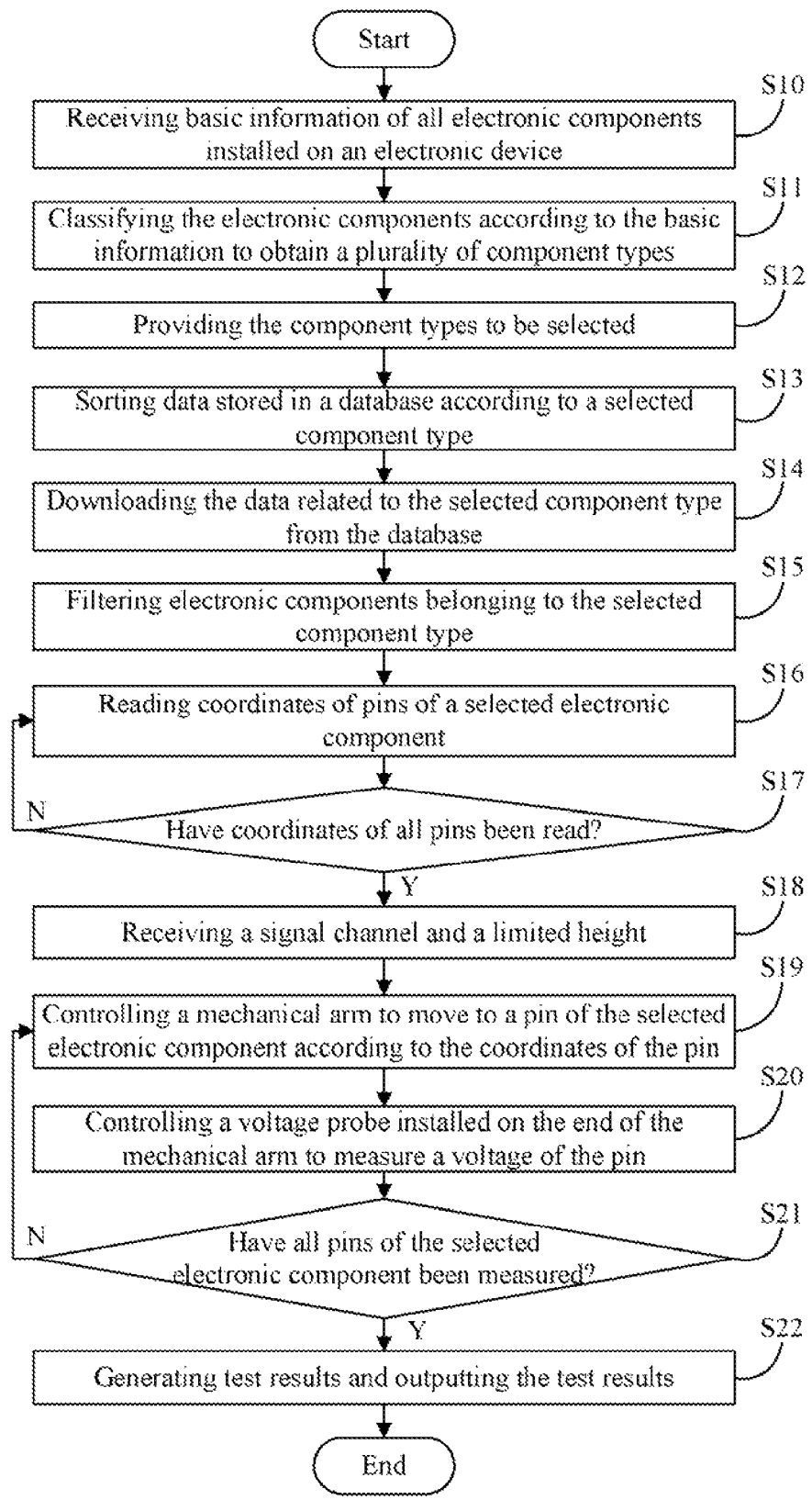
FIG. 3 is a flowchart of one embodiment of a method for measuring pin voltage of electronic components.

FIG. 3 is a flowchart of one embodiment of a method for measuring pin voltages of electronic components. The method can be performed by execution of a computer readable program code by at least one processor of at least one computer system. Depending on the embodiment, additional blocks in the flow of FIG. 3 may be added, others removed, and the ordering of the blocks may be changed.

In block S10, the database 3 receives basic data of electronic components installed in the electronic device 4. The basic data includes, but is not limited to, names, coordinates of the coordinate system 23, and heights of the electronic components. The names of the electronic components may be resistor R1, R2, or R3, for example.

In block S11, the database 3 classifies the electronic components according to the basic data to obtain a plurality of component types of the electronic components. The component types may include, a resistor, a capacitor, or an inductor, for example.

In block S12, the selection module 100 provides the component types of the electronic components to a user for selecting a component type via the display 13 of the measurement control device 1.

In block S13, the download module 101 sorts the basic data related to a selected component type in the database 3. As mentioned above, the basic data may include names, coordinates of the coordinate system 23, and heights of the electronic components belonging to the selected component type. The names of the electronic components may be resistors R1, R2, or R3, for example.

In block S14, the download module 101 downloads the basic data from the database 3 to the measurement control device 1.

In block S15, the filtration module 102 filters electronic components to be measured according to the selected component type, so the user can select one of the electronic components to measure pin voltages via the display 13 of the measurement control device 1. If the selected component type is a resistor, the filtration module 102 filters all the resistors R1, R2, or R3, for example, installed in the electronic device 4.

In block S16, the reading module 103 reads the pin coordinates of the selected electronic component from the database 3.

In block S17, the determination module 104 determines if coordinates of all the pins of the selected electronic component have been read. If the coordinates of all the pins have been read, block S18 is implemented. Otherwise, if the coordinates of any pin have not been read, block S16 is repeated.

In block S18, the receiving module 105 receives a signal channel and a limited height of the mechanical arm 21. It is noteworthy that, the signal channel is used to transmit control signals sent by the measurement control device 1. The control signals can control the mechanical arm 21 to move. The limited height is a minimum distance between the platform 20 and the voltage probe 22 when the mechanical arm 21 moves. In one embodiment, the limited height is greater than or equal to the distance between the platform 20 and the peak of the electronic device 4. It is noteworthy that, the peak can be computed according to the heights of the electronic components installed in the electronic device 4.

In block S19, the movement control module 106 sends control signals using the signal channel to control the mechanical arm 21 to move to the place of a pin of the selected electronic component according to the coordinates of the pin.

In block S20, the measurement control module 107 controls the voltage probe 22 to measure a voltage of the pin.

In block S21, the determination module 104 determines if all pins of the selected electronic component have been measured. If all pins of the selected electronic component have been measured, block S22 is implemented. If any of the pins of the selected electronic component has not been measured, block S19 is repeated.

In block S22, the test result generation module 108 generates test results including the voltage of the pins of the selected electronic component, and outputs the test results to display on the display 13 of the measurement control device 1.

The method described herein can be implemented as computer-readable instructions stored on a computer-readable storage medium that when executed by a computer will perform the methods described herein.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A method for measuring pin voltages of electronic components of an electronic device using a measurement control device and a measurement machine, the method comprising:
    (a) storing basic data of the electronic components into a database which communicates with the measurement control device, wherein the basic data comprises names and pin coordinates of the electronic components, and classifying the electronic components into a plurality of component types according to the names by the database;
    (b) sorting the basic data related to a component type selected from the plurality of component types with the measurement control device;
    (c) filtering the electronic components which belong to the selected component type with the measurement control device;
    (d) reading the pin coordinates of an electronic component selected from the filtered electronic components from the database with the measurement control device;
    (e) controlling a mechanical arm of the measurement machine to move to a pin of the selected electronic component according to the pin coordinates with the measurement control device;
    (f) controlling a voltage probe installed on the end of the mechanical arm to measure a voltage of the pin with the measurement control device;
    (g) repeating steps from (e) to (f) until all pins of the selected electronic component have been measured; and
    (h) generating test results including the voltages of the pins of the selected electronic component with the measurement control device, and outputting the test results to display on a display of the measurement control device.

2. The method as described in claim 1, wherein the component types of the electronic components comprise resistors, capacitors, and inductors.

3. The method as described in claim 1, wherein the basic data further comprises heights of the electronic components.

4. A non-transitory storage medium having stored thereon instructions that, when executed by at least one processor of a computing device, cause the computing device to perform a method for measuring pin voltages of electronic components installed in an electronic device, the method comprising:

(a) storing basic data of the electronic components into a database which communicates with the computing device, wherein the basic data comprises names and pin coordinates of the electronic components, and classifying the electronic components into a plurality of component types according to the names by the database;

(b) sorting the basic data related to a component type selected from the plurality of component types with the computing device;

(c) filtering the electronic components which belong to the selected component type with the computing device;

(d) reading the pin coordinates of an electronic component selected from the filtered electronic components from the database with the computing device;

(e) controlling a mechanical arm of a measurement machine to move to a pin of the selected electronic component according to the pin coordinates with the computing device;

(f) controlling a voltage probe installed on the end of the mechanical arm to measure a voltage of the pin with the computing device;

(g) repeating steps from (e) to (f) until all pins of the selected filtered electronic component have been measured; and (h) generating test results including the voltages of the pins of the selected electronic component, and outputting the test results to display on a display of the computing device.

5. The non-transitory storage medium as described in claim 4, wherein the component types of the electronic components comprise resistors, capacitors, and inductors.

6. The non-transitory storage medium as described in claim 4, wherein the basic data further comprises heights of the electronic components.

7. A system for measuring pin voltages of electronic components installed in an electronic device, the system comprising:

a measurement machine comprising a platform that places the electronic device, a mechanical arm, and a voltage probe installed on the end of the mechanical arm; and a database that stores basic data of the electronic components comprising names and pin coordinates, of the electronic components, and classifies the electronic components into a plurality of component types according to the names;

a measurement control device communicating with the database and measurement machine, and comprising:

a download module operable to sort the basic data related to a component type selected from the plurality of component types;

a filtration module operable to filter the electronic components which belong to the selected component type;

a reading module operable to read the pin coordinates of an electronic component selected from the filtered electronic components from the database;

a movement control module operable to control the mechanical arm to move to the pins of the selected electronic component according to the pin coordinates;

a measurement control module operable to control the voltage probe to measure voltages of the pins; and a test result generation module operable to generate test results including the voltages of the pins of the selected electronic component, and output the test results on a display of the measurement control device.

8. The system as described in claim 7, wherein the component types of the electronic components comprise resistors, capacitors, and inductors.

9. The system as described in claim 7, wherein the basic data further comprises heights of the electronic components.

* * * * *

UNITED STATES PATENT AND TRADEMARK OFFICE
CERTIFICATE OF CORRECTION

| | | |
|---|---|---|
| PATENT NO. | : 8,301,405 B2 | Page 1 of 1 |
| APPLICATION NO. | : 12/754595 | |
| DATED | : October 30, 2012 | |
| INVENTOR(S) | : Hsien-Chuan Liang et al. | |

It is certified that error appears in the above-identified patent and that said Letters Patent is hereby corrected as shown below:

On the Title Page, please add Item (30) regarding "Foreign Application Priority Data"

(30) Dec. 30, 2009 (CN) ..............................2009 1 0312815.2

Signed and Sealed this
Thirtieth Day of April, 2013

Teresa Stanek Rea
*Acting Director of the United States Patent and Trademark Office*